(12) United States Patent
Bando et al.

(10) Patent No.: US 12,672,560 B2
(45) Date of Patent: Jun. 30, 2026

(54) SEMICONDUCTOR DEVICE INCLUDING SEMICONDUCTOR ELEMENTS, INSULATING BASE MEMBERS, WIRINGS, AND AT LEAST ONE WIRING MEMBER

(71) Applicant: SHINKO ELECTRIC INDUSTRIES CO., LTD., Nagano (JP)

(72) Inventors: Koji Bando, Nagano (JP); Kenichi Koi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 776 days.

(21) Appl. No.: 17/984,496

(22) Filed: Nov. 10, 2022

(65) Prior Publication Data

US 2023/0145328 A1 May 11, 2023

(30) Foreign Application Priority Data

Nov. 11, 2021 (JP) ................................. 2021-183971

(51) Int. Cl.
*H10W 70/63* (2026.01)
*H10W 70/20* (2026.01)
*H10W 70/40* (2026.01)

(52) U.S. Cl.
CPC ......... *H10W 70/635* (2026.01); *H10W 70/20* (2026.01); *H10W 70/464* (2026.01)

(58) Field of Classification Search
CPC ............... H01L 23/49827; H01L 24/24; H01L 23/4824; H10W 70/635; H10W 70/20; H10W 70/464
See application file for complete search history.

(56) References Cited

U.S. PATENT DOCUMENTS

| | | | |
|---|---|---|---|
| 2009/0072384 A1* | 3/2009 | Wong | H01L 25/0655 257/E23.101 |
| 2010/0221872 A1* | 9/2010 | Islam | H01L 23/3107 438/124 |
| 2014/0070396 A1 | 3/2014 | Kyozuka et al. | |

(Continued)

FOREIGN PATENT DOCUMENTS

JP 2016-046523 4/2016

OTHER PUBLICATIONS

European Search Report corresponding to EP 22206668.0, dated Apr. 5, 2023, 11 pages.

*Primary Examiner* — Zandra V Smith
*Assistant Examiner* — Corbyn D Mellinger
(74) *Attorney, Agent, or Firm* — Rankin, Hill & Clark LLP

(57) ABSTRACT

A semiconductor device includes: a first semiconductor element; a second semiconductor element; a first insulating base member including a fifth face and a sixth face; a second insulating base member including a seventh face and an eighth face; a first wiring that penetrates through the first insulating base member, and disposed on the sixth face; a second wiring that penetrates through the second insulating base member, and disposed on the eighth face; a first wiring member that faces the second face of the first semiconductor element; and a second wiring member that is provided on the second wiring. The first wiring member is provided on the seventh face of the second insulating base member. A current flows in a first direction in the first wiring member, and flows in a second direction opposite to the first direction in the second wiring member.

15 Claims, 8 Drawing Sheets

(56) References Cited

U.S. PATENT DOCUMENTS

| | | | |
|---|---|---|---|
| 2016/0056136 A1 | 2/2016 | McConnelee et al. | |
| 2017/0207160 A1* | 7/2017 | Gowda | H01L 25/16 |
| 2017/0250093 A1 | 8/2017 | McConnelee et al. | |
| 2018/0082857 A1 | 3/2018 | McConnelee et al. | |

* cited by examiner

SEMICONDUCTOR DEVICE INCLUDING SEMICONDUCTOR ELEMENTS, INSULATING BASE MEMBERS, WIRINGS, AND AT LEAST ONE WIRING MEMBER

This application claims priority from Japanese Patent Application No. 2021-183971, filed on Nov. 11, 2021, the entire contents of which are herein incorporated by reference.

BACKGROUND

Technical Field

The present disclosure relates to a semiconductor device.

Background Art

There has been known a semiconductor device in which each of semiconductor elements is attached to a film of a resin such as polyimide through an adhesive layer and a wiring layer is formed on a face of the resin film on an opposite side to the adhesive layer (e.g. see JP-A-2016-046523).

On the other hand, further reduction of inductance generated in the semiconductor device is demanded to achieve high-speed switching operation of the semiconductor device.

The present disclosure aims to provide a semiconductor device capable of reducing inductance.

SUMMARY

A certain embodiment provides a semiconductor device. The semiconductor device includes: a first semiconductor element including a first face and a second face opposite to the first face, wherein a first electrode is provided in the first face and a second electrode is provided in the second face; a second semiconductor element including a third face and a fourth face opposite to the third face, wherein a third electrode is provided in the third face and a fourth electrode is provided in the fourth face; a first insulating base member including a fifth face to which the first face of the first semiconductor element is adhesively bonded, and a sixth face opposite to the fifth face; a second insulating base member including a seventh face to which the third face of the second semiconductor element is adhesively bonded, and an eighth face opposite to the seventh face; a first wiring that penetrates through the first insulating base member to be electrically connected to the first electrode, and that is disposed on the sixth face of the first insulating base member; a second wiring that penetrates through the second insulating base member to be electrically connected to the third electrode, and that is disposed on the eighth face of the second insulating base member; a first wiring member that faces the second face of the first semiconductor element, and that is electrically connected to the second electrode; and a second wiring member that is provided on the second wiring to be electrically connected to the second wiring. The first wiring member is provided on the seventh face of the second insulating base member. The first wiring member and the second wiring member face each other and are electrically connected to each other. A current flows in a first direction in the first wiring member, and flows in a second direction opposite to the first direction in the second wiring member.

A certain embodiment provides a semiconductor device. The semiconductor device includes: a first semiconductor element including a first face and a second face opposite to the first face, wherein a first electrode is provided in the first face and a second electrode is provided in the second face; a second semiconductor element including a third face and a fourth face opposite to the third face, wherein a third electrode is provided in the third face and a fourth electrode is provided in the fourth face; a first insulating base member including a fifth face to which the first face of the first semiconductor element is adhesively bonded, and a sixth face opposite side to the fifth face; a second insulating base member including a seventh face to which the third face of the second semiconductor element is adhesively bonded, and an eighth face opposite to the seventh face; a first wiring that penetrates through the first insulating base member to be electrically connected to the first electrode, and that is disposed on the sixth face of the first insulating base member; a second wiring that penetrates through the second insulating base member to be electrically connected to the third electrode, and that is disposed on the eighth face of the second insulating base member; and a first wiring member that faces the second face of the first semiconductor element, and that is electrically connected to the second electrode. The first wiring member is provided on the seventh face of the second insulating base member. The first wiring member and the second wiring face each other, and are electrically connected to each other. A current flows in a first direction in the first wiring member, and flows in a second direction opposite to the first direction in the second wiring.

BRIEF DESCRIPTION OF DRAWINGS

FIG. 7 is a sectional view showing a semiconductor device according to a second embodiment.

DESCRIPTION OF EMBODIMENTS

Embodiments of the present disclosure will be described below specifically with reference to the accompanying drawings. Incidentally, in the description of the present disclosure and the drawings, constituent elements that have substantially the same functional configurations will be designated by the same reference signs correspondingly and respectively, and duplicated explanation about these constituent elements may be therefore omitted. In addition, in the present disclosure, an X1-X2 direction, a Y1-Y2 direction and a Z1-Z2 direction are set as directions mutually orthogonal to one another. A plane including the X1-X2 direction and the Y1-Y2 direction will be described as XY plane, a plane including the Y1-Y2 direction and the Z1-Z2 direction will be described as YZ plane, and a plane including the Z1-Z2 direction and the X1-X2 direction will be described as ZX plane. Incidentally, for convenience, the Z1-Z2 direction will be set as an up-down direction, with the Z1 side being an upper side and the Z2 side being a lower side. In addition, the term "plan view" will mean a view of an object from the Z1 side, and the term "planar shape" will mean the shape of the object viewed from the Z1 side. However, a semiconductor device can be used in a vertically inverted state, or can be disposed at any angle.

First Embodiment

Figure 1:
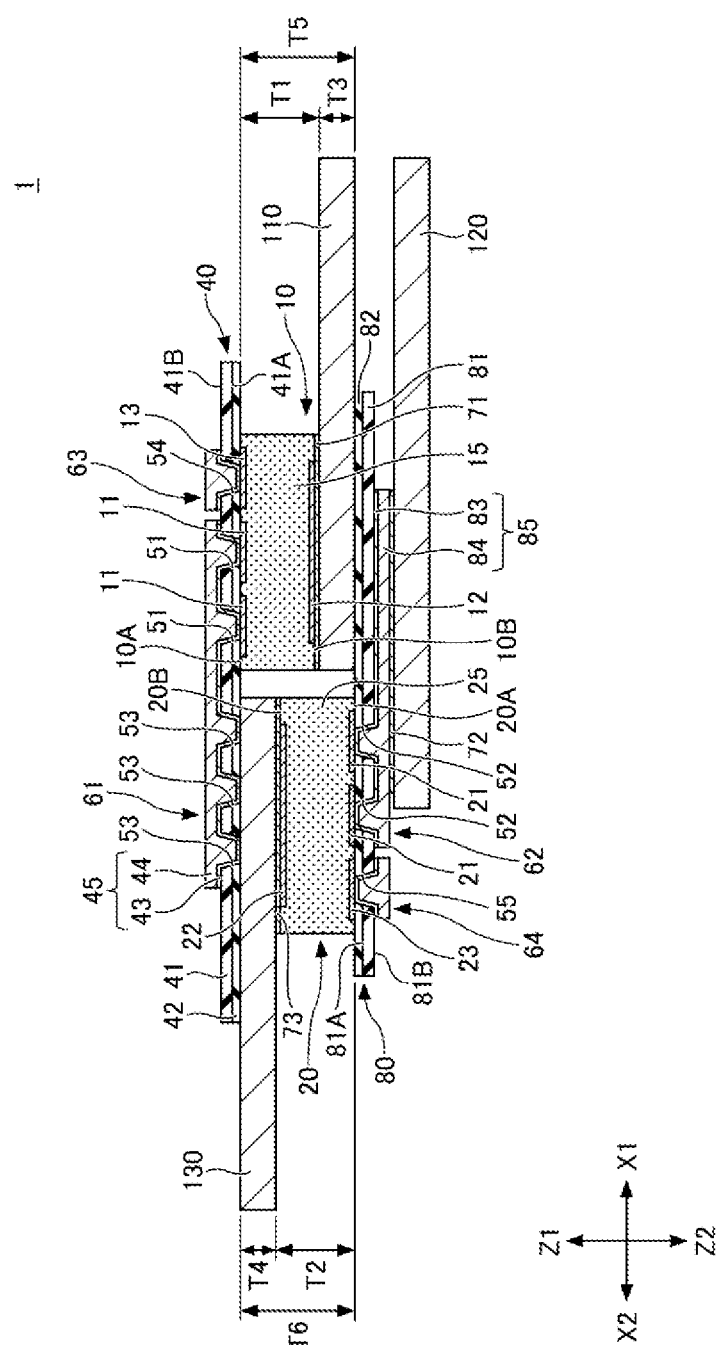
FIG. 1 is a sectional view showing a semiconductor device according to a first embodiment.

First, a first embodiment will be described. The first embodiment relates to a semiconductor device.
[Configuration of Semiconductor Device]
First, a sectional configuration of the semiconductor device according to the first embodiment will be described. FIG. 1 is a sectional view showing the semiconductor device according to the first embodiment.

As shown in FIG. 1, the semiconductor device 1 according to the first embodiment has a semiconductor element 10, a semiconductor element 20, a flexible wiring substrate 40, and a flexible wiring substrate 80. For example, a device using silicon (Si) or silicon carbide (SiC) can be used as each of the semiconductor elements 10 and 20. For example, a device using gallium nitride (GaN), gallium arsenide (GaAs) etc. also can be used as the semiconductor element 10, 20. For example, a semiconductor element acting as an active element (e.g. a silicon chip such as a CPU), an insulated gate bipolar transistor (IGBT), a metal-oxide-semiconductor field-effect transistor (MOSFET), a diode, etc. can be used as the semiconductor element 10, 20. The semiconductor element 10, 20 according to the present embodiment is a semiconductor element which includes electrodes provided in its front and back faces. The semiconductor element 10, 20 can be set to have any shape and any size in terms of the planar shape. The semiconductor element 10, 20 is, for example, formed into a rectangular shape in terms of the planar shape. Thickness of the semiconductor element 10, 20 can be, for example, set in a range of about 50 μm to 500 μm.

The semiconductor element 10 has one face 10A, and the other face 10B located on an opposite side to the face 10A. In addition, the semiconductor element 10 has a body portion 15, electrodes 11, an electrode 12, and an electrode 13. The electrodes 11 and the electrode 13 are provided in the face 10A, and the electrode 12 is provided in the other face 10B. For example, the electrodes 11, the electrode 12, and the electrode 13 can be set as source electrodes, a drain electrode, and a gate electrode, respectively.

The semiconductor element 20 has one face 20A, and the other face 20B located on an opposite side to the face 20A. In addition, the semiconductor element 20 has a body portion 25, electrodes 21, an electrode 22, and an electrode 23. The electrodes 21 and the electrode 23 are provided in the face 20A, and the electrode 22 is provided in the other face 20B. For example, the electrodes 21, the electrode 22, and the electrode 23 can be set as source electrodes, a drain electrode, and a gate electrode, respectively.

For example, any of metals such as aluminum (Al) and copper (Cu), or an alloy containing at least one metal selected from these metals can be used as the material of the electrodes 11, the electrode 12, the electrode 13, the electrodes 21, the electrode 22, and the electrode 23 (which may be hereinafter generically referred to as "electrodes"). Incidentally, if occasions demand, a surface treatment layer may be formed on each of surfaces of the electrodes. Examples of the surface treatment layer include a gold (Au) layer, a nickel (Ni) layer/Au layer (a metal layer in which the Ni layer and the Au layer are deposited in the named order), an Ni layer/palladium (Pd) layer/Au layer (a metal layer in which the Ni layer, the Pd layer, and the Au layer are deposited in the named order), etc. For example, a metal layer formed by an electroless plating method (an electroless plated metal layer) can be used as each of the Au layer, the Ni layer, and the Pd layer. In addition, the Au layer is a metal layer made of Au or an Au alloy, and the Ni layer is a metal layer made of Ni or an Ni alloy, and the Pd layer is a metal layer made of Pd or a Pd alloy.

The flexible wiring substrate 40 has an insulating base member 41, an insulating adhesive layer 42, and a wiring layer 45. The insulating base member 41 has one face 41A, and the other face 41B located on an opposite side to the face 41A. The adhesive layer 42 is provided under the face 41A, and the wiring layer 45 is provided on the other face 41B. The wiring layer 45 is deposited on the other face 41B. The wiring layer 45 has a seed layer 43 and a metal layer 44.

The flexible wiring substrate 80 has an insulating base member 81, an insulating adhesive layer 82, and a wiring layer 85. The insulating base member 81 has one face 81A, and the other face 81B located on an opposite side to the face 81A. The adhesive layer 82 is provided on the face 81A, and the wiring layer 85 is provided under the other face 81B. The wiring layer 85 is deposited on the other face 81B. The wiring layer 85 has a seed layer 83 and a metal layer 84.

For example, a resin film etc. can be used as each of the insulating base members 41 and 81. An insulating resin such as a polyimide-based resin, a polyethylene-based resin or an epoxy-based resin can be used as the material of the resin film. The insulating base member 41, 81 has, for example, flexibility. Here, the term "flexibility" means a property of being able to be bent or flexed. The insulating base member 41, 81 can be set to have any shape and any size in terms of the planar shape. The insulating base member 41, 81 is, for example, formed into a rectangular shape in terms of the planar shape. Thickness of the insulating base member 41, 81 can be, for example, set in a range of about 50 μm to 100 μm.

The semiconductor device 1 further has a lead terminal 110, a lead terminal 120, and a lead terminal 130. Each of the lead terminals 110, 120, and 130 is, for example, formed from a lead frame. The lead terminal 110, 120, 130 is an example of a wiring member.

The semiconductor element 10 and the lead terminal 130 are adhesively bonded to the face 41A of the insulating base member 41 by the adhesive layer 42. The face 10A of the semiconductor element 10 faces the face 41A of the insulating base member 41. Moreover, one face (Z1 side) of the lead terminal 130 faces the face 41A of the insulating base member 41. Through holes 51 where the electrodes 11 are exposed, through holes 53 where the lead terminal 130 is exposed, and a through hole 54 where the electrode 13 is exposed are formed in the insulating base member 41 and the adhesive layer 42.

As the material of the adhesive layer 42, for example, an adhesive agent such as an epoxy-based adhesive agent, a polyimide-based adhesive agent, or a silicone-based adhesive agent can be used. Thickness of the adhesive layer 42 can be, for example, set in a range of about 20 μm to 40 μm.

For example, the electrodes 11 and the through holes 51 are located on an X2 side of the electrode 13 and the through hole 54, and the electrodes 21 and through holes 52 are located on an X1 side of the electrode 23 and a through hole 55. Pairs of the electrodes 11 and the through holes 51 may be provided, and pairs of the electrodes 21 and the through holes 52 may be provided.

The wiring layer 45 has a wiring 61 connected to the electrodes 11 through the through holes 51, and a wiring 63 connected to the electrode 13 through the through hole 54. The wiring 61 is also connected to the lead terminal 130 through the through holes 53.

The wiring 61 includes via wirings filled in the through holes 51, via wirings filled in the through holes 53, and a wiring pattern formed on the other face 41B of the insulating base member 41. The wiring 63 includes a via wiring filled in the through hole 54, and a wiring pattern formed on the other face 41B of the insulating base member 41.

The seed layer 43 covers the other face 41B of the insulating base member 41 and inner faces of the through holes 51, 53 and 54. The seed layer 43 is formed to continuously cover the other face 41B of the insulating base member 41, the inner faces of the through holes 51, 53 and 54, and faces of the electrodes 11, 12, and 13 and a face of the lead terminal 130 exposed at the bottoms of the through holes 51, 53, and 54. A metal film (sputtered film) formed by a sputtering method can be used as the seed layer 43. For example, a metal film with a two-layer structure in which a titanium (Ti) layer made of Ti and a copper (Cu) layer made of Cu are sequentially deposited on the other face 41B of the insulating base member 41 and the inner faces of the through holes 51, 53, and 54 can be used as the seed layer 43 formed by the sputtering method. In this case, thickness of the Ti layer can be, for example, set in a range of about 10 nm to 300 nm, and thickness of the Cu layer can be, for example, set in a range of about 100 nm to 1000 nm. Incidentally, the Ti layer functions as a close contact layer that improves close contactability of the seed layer 43 with the insulating base member 41 and the electrodes etc. In addition, the Ti layer also functions as a metal barrier layer that restrains copper from diffusing from the Cu layer etc. into the insulating base member 41 etc. In addition to the Ti, titanium nitride (TiN), tantalum nitride (TaN), tantalum (Ta), chrome (Cr), etc. can be used as the material of such a metal film functioning as the close contact layer and the metal barrier layer.

The semiconductor element 20 and the lead terminal 110 are adhesively bonded to the face 81A of the insulating base member 81 by the adhesive layer 82. The face 20A of the semiconductor element 20 faces the face 81A of the insulating base member 81. The through holes 52 where the electrodes 21 are exposed and the through hole 55 where the electrode 23 is exposed are formed in the insulating base member 81 and the adhesive layer 82.

For example, an adhesive agent such as an epoxy-based adhesive agent, a polyimide-based adhesive agent, or a silicone-based adhesive agent can be used as the material of the adhesive layer 82. Thickness of the adhesive layer 82 can be, for example, set in a range of about 20 μm to 40 μm.

The wiring layer 85 has a wiring 62 connected to the electrodes 21 through the through holes 52, and a wiring 64 connected to the electrode 23 through the through hole 55.

The wiring 62 includes via wirings filled in the through holes 52, and a wiring pattern formed on the other face 81B of the insulating base member 81. The wiring 64 includes a via wiring filled in the through hole 55, and a wiring pattern formed on the other face 81B of the insulating base member 81.

The seed layer 83 covers the other face 81B of the insulating base member 81 and inner faces of the through holes 52 and 55. The seed layer 83 is formed to continuously cover the other face 81B of the insulating base member 81, the inner faces of the through holes 52 and 55, and faces of the electrodes exposed at the bottoms of the through holes 52 and 55. A metal film (sputtered film) formed by a sputtering method can be used as the seed layer 83. For example, a metal film with a two-layer structure in which a titanium (Ti) layer made of Ti and a copper (Cu) layer made of Cu are sequentially deposited on the other face 81B of the insulating base member 81 and the inner faces of the through holes 52 and 55 can be used as the seed layer 83 formed by the sputtering method. In this case, thickness of the Ti layer can be, for example, set in a range of about 10 nm to 300 nm, and thickness of the Cu layer can be, for example, set in a range of about 100 nm to 1000 nm. Incidentally, the Ti layer functions as a close contact layer that improves close contactability of the seed layer 83 with the insulating base member 81 and the electrodes etc. In addition, the Ti layer also functions as a metal barrier layer that restrains copper from diffusing from the Cu layer etc. into the insulating base member 81 etc. In addition to the Ti, titanium nitride (TiN), tantalum nitride (TaN), tantalum (Ta), chrome (Cr), etc. can be used as the material of such a metal film functioning as the close contact layer and the metal barrier layer.

For example, copper or a copper alloy can be used as the material of the metal layers 44 and 84. For example, a metal layer formed by an electrolytic plating method (an electrolytic plated metal layer) can be used as each of the metal layers 44 and 84.

One face (Z1 side) of the lead terminal 110 is bonded to the electrode 12 of the semiconductor element 10 by an electrically conductive adhesive layer 71. Moreover, the other face (Z2 side) of the lead terminal 110 is adhesively bonded to the adhesive layer 82. One face (Z1 side) of the lead terminal 120 is bonded to the wiring 62 of the wiring layer 45 by an electrically conductive adhesive layer 72. One face (Z2 side) of the lead terminal 130 is bonded to the electrode 22 of the semiconductor element 20 by an electrically conductive adhesive layer 73. Moreover, the other side (Z1 side) of the lead terminal 130 is adhesively bonded to the adhesive layer 42 to be electrically connected to the wiring 61. Each of the electrically conductive adhesive layers 71 to 73 is, for example, a solder layer or a sintered metal layer. The electrically conductive adhesive layer 71, 72, 73 may be made of an electrically conductive paste.

The semiconductor element 10 and the semiconductor element 20 are arranged side by side in a horizontal direction, e.g., in the X1-X2 direction. The semiconductor element 20 is positioned on an X2 side of the semiconductor element 10.

The lead terminals 110 and 120 extend in parallel with each other toward the X1 side, as viewed from the semiconductor element 10. Accordingly, the semiconductor element 20 is disposed on an opposite side of the semiconductor element 10 to the direction in which the lead terminals 110 and 120 extend, as viewed from the semiconductor element 10. A distance between the lead terminals 110 and 120 is nearly comparable to thickness of the flexible wiring substrate 80. The distance between the lead terminals 110 and 120 is, for example, 1 mm or less (preferable in a range of 50 μm to 100 μm). Moreover, the lead terminal 130 extends toward the X2 side, as viewed from the semiconductor element 10. The lead terminals 110 and 120 face each other in the Z1-Z2 direction, and are electrically connected to each other.

For example, thickness T1 of the semiconductor element 10 and thickness T2 of the semiconductor element 20 are equal to each other. Moreover, thickness T3 of the lead terminal 110 and thickness T4 of the lead terminal 130 are equal to each other. Therefore, thickness T5 of a laminate structure body of the lead terminal 110 and the semiconductor element 10 and thickness T6 of a laminate structure body of the semiconductor element 20 and the lead terminal 130 are equal to each other. Incidentally, the term "equal" in the present disclosure does not mean that the both are mathematically perfectly consistent with each other, but rather means that the both are in such a relationship that the both can be said to be "equal" to each other under socially accepted conventions. For example, one of the both is in a range of about 90% to 110% of the other.

The electrode 12 of the semiconductor element 10 is electrically connected to the lead terminal 110. The electrodes 21 of the semiconductor element 20 are electrically connected to the lead terminal 120 through the wiring 62. The electrodes 11 of the semiconductor element 10 and the electrode 22 of the semiconductor element 20 are electrically connected to the lead terminal 130 through the wiring 61. Moreover, a lead terminal (not shown) is also connected to the wiring 63 of the wiring layer 45, and this lead terminal is electrically connected to the electrode 13 of the semiconductor element 10. In the same manner or a similar manner, a lead terminal (not shown) is also connected to the wiring 64 of the wiring layer 85, and this lead terminal is electrically connected to the electrode 23 of the semiconductor element 20.

Figure 2:
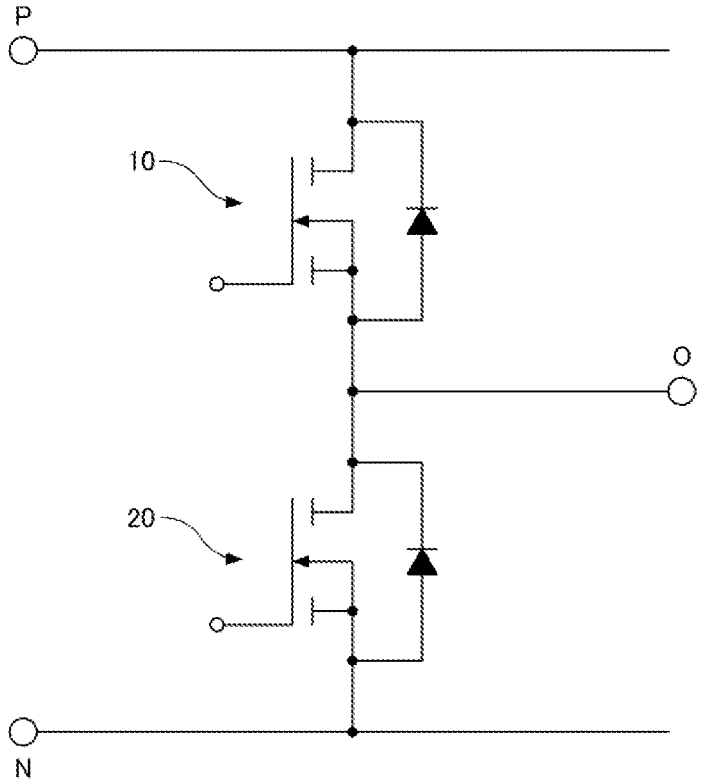
FIG. 2 is a circuit diagram showing the semiconductor device according to the first embodiment.

Here, a circuit configuration of the semiconductor device 1 according to the first embodiment will be described. FIG. 2 is a circuit diagram showing the semiconductor device according to the first embodiment.

As shown in FIG. 2, the electrode 12 of the semiconductor element 10 is electrically connected to a P terminal through the lead terminal 110. The electrodes 21 of the semiconductor element 20 are electrically connected to an N terminal through the lead terminal 120. Moreover, the electrodes 11 of the semiconductor element 10 and the electrode 22 of the semiconductor element 20 are electrically connected to an O terminal through the lead terminal 130. The P terminal is a positive input terminal, the N terminal is a negative input terminal, and the O terminal is an output terminal. Accordingly, a current flows in the lead terminal 110 in a reverse direction to a direction in which the current flows in the lead terminal 120.

[Method for Manufacturing Semiconductor Devices]

Next, a method for manufacturing the semiconductor devices according to the first embodiment will be described. FIGS. 3A to 3C, FIGS. 4A to 4C, FIGS. 5A and 5B, and FIGS. 6A and 6B are sectional views showing the method for manufacturing the semiconductor devices according to the first embodiment. In the following description, a so-called multiple-piece manufacturing method will be described. That is, a part corresponding to a large number of semiconductor devices 1 is produced by batch and then divided into individual pieces to manufacture the semiconductor devices 1. Incidentally, for convenience of explanation, portions that will finally become constituent elements of each of the semiconductor devices 1 will be designated by the same reference signs as those for the final constituent elements.

Figures 3A, 3B, 3C:
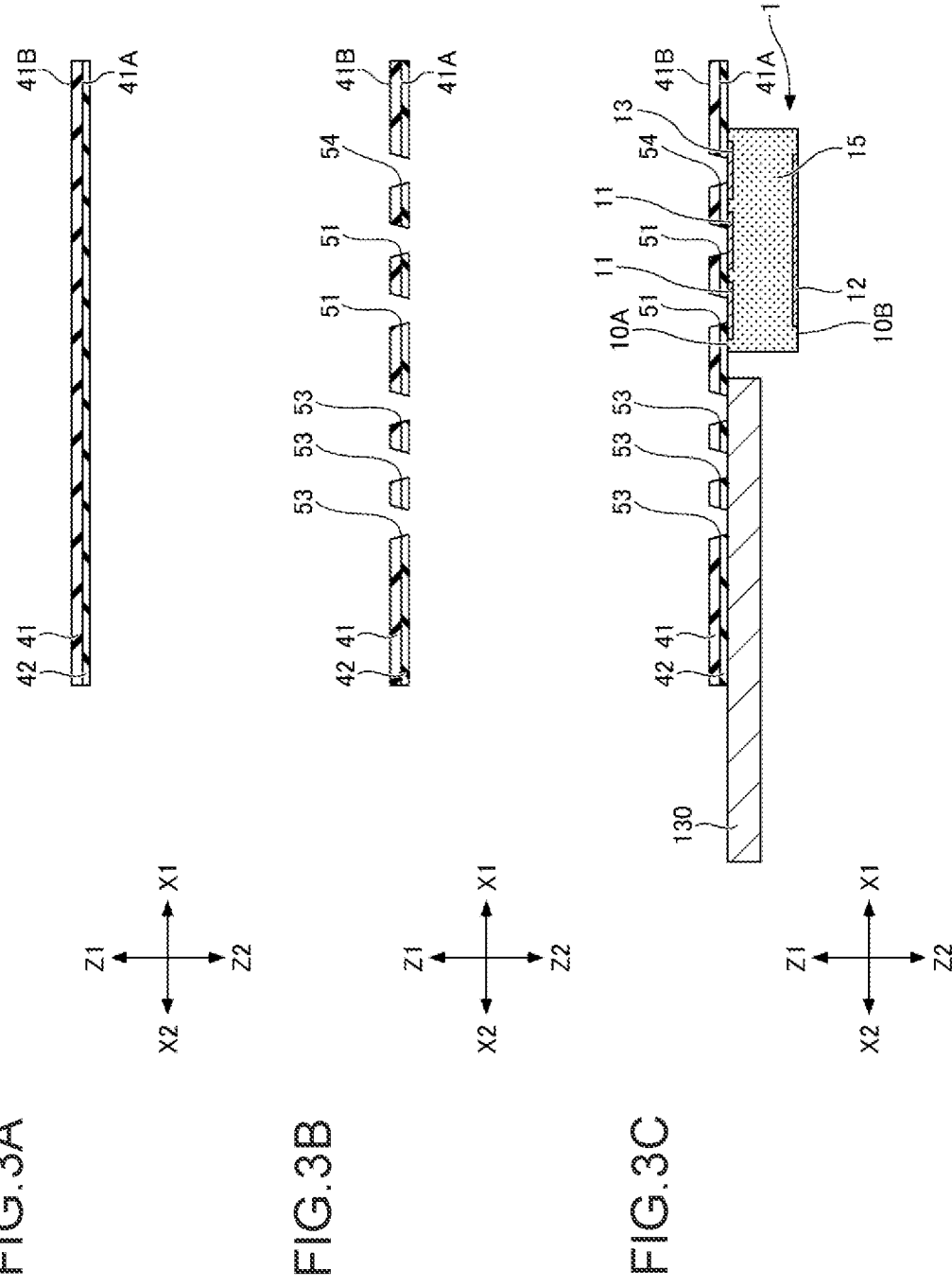
FIGS. 3A to 3C are sectional views showing a method for manufacturing each semiconductor device according to the first embodiment (Part 1)

First, as shown in FIG. 3A, a large-sized insulating base member 41 having one face 41A and the other face 41B is prepared. In the large-sized insulating base member 41, for example, a plurality of individual regions in each of which a semiconductor device 1 should be formed are consecutively provided in a matrix form. Here, the individual regions are regions each of which will be finally cut into an individual piece along predetermined cutting lines to form the individual semiconductor device 1. Incidentally, the number of the individual regions contained in the large-sized insulating base member 41 is not limited particularly. An insulating adhesive layer 42 that covers the entire face 41A of the insulating base member 41 is provided on the face 41A.

Next, as shown in FIG. 3B, through holes 51, 53, and 54 are formed at required places in the insulating base member 41 and the adhesive layer 42 to penetrate through the insulating base member 41 and the adhesive layer 42 in a thickness direction. The through holes 51, 53 and 54 can be formed, for example, by a laser machining method using a $CO_2$ laser, a UV-YAG laser, etc. or by a punching method. For example, the through holes 51 are formed on an X2 side of the through hole 54, and the through holes 53 are formed on an X2 side of the through holes 51.

Next, as shown in FIG. 3C, a semiconductor element 10 and a lead terminal 130 are adhesively bonded to the insulating base member 41 by the adhesive layer 42. On this occasion, alignment is performed to make one face 10A of the semiconductor element 10 face the face 41A of the insulating base member 41, so that electrodes 11 overlap with the through holes 51 and an electrode 13 overlaps with the through hole 54 in plan view. In addition, alignment is performed to make the lead terminal 130 overlap with the through holes 53 in plan view.

Figures 4A, 4B, 4C:
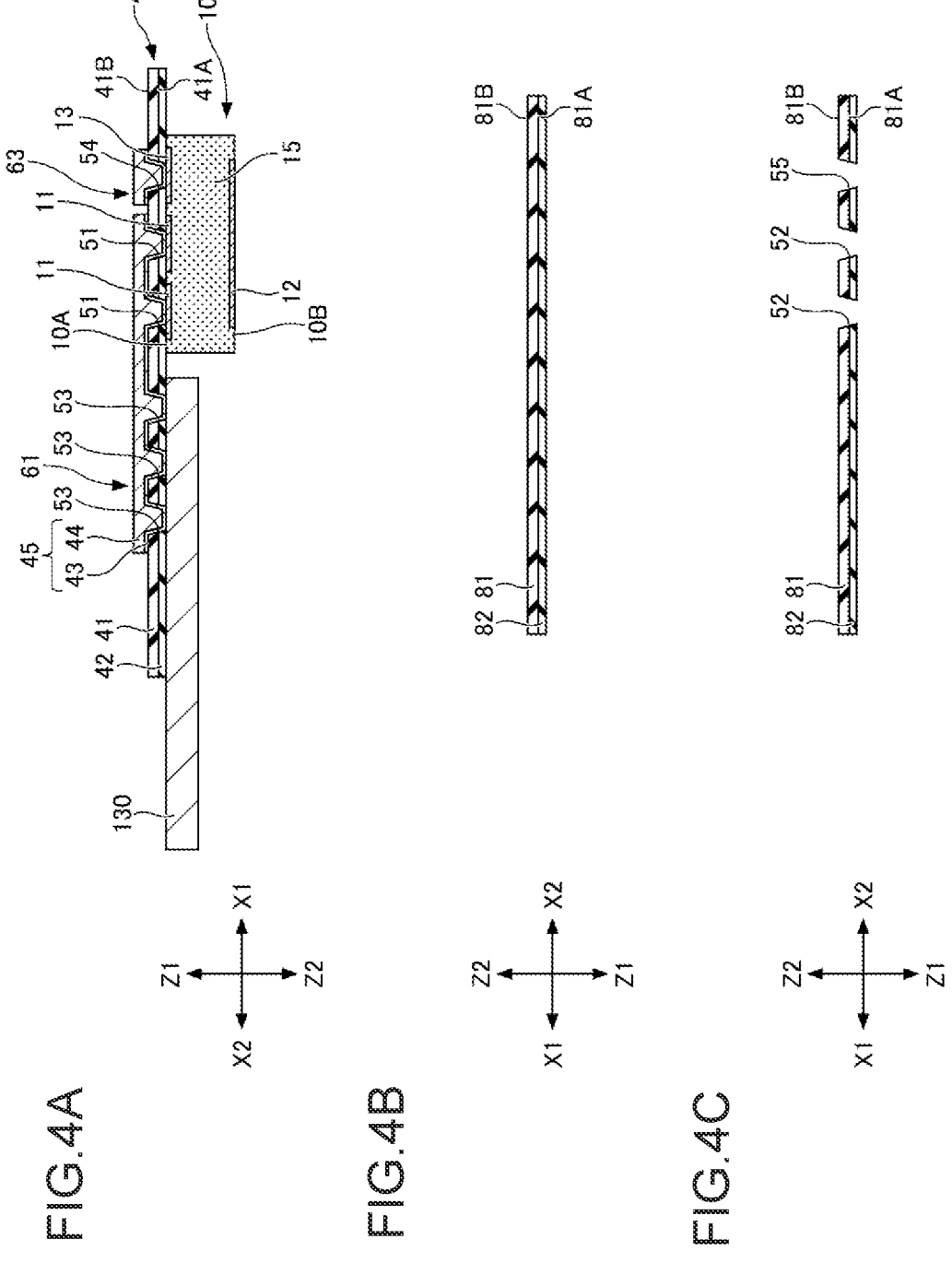
FIGS. 4A to 4C are sectional views showing the method for manufacturing the semiconductor device according to the first embodiment (Part 2)

Next, as shown in FIG. 4A, a wiring layer 45 including a seed layer 43 and a metal layer 44 is formed on the other face 41B of the insulating base member 41. The wiring layer 45 can be formed, for example, by a semi-additive method.

Specifically, the seed layer 43 is formed to cover the entire other face 41B of the insulating base member 41 and entire inner faces of the through holes 51, 53 and 54. The seed layer 43 can be formed, for example, by a sputtering method or an electroless plating method. In the case where, for example, the seed layer 43 is formed by the sputtering method, first, titanium is deposited by sputtering to form a Ti layer to thereby cover the other face 41B of the insulating base member 41 and the inner faces of the through holes 51, 53, and 54. Then, copper is deposited on the Ti layer by sputtering to form a Cu layer. Thus, the seed layer 43 having a two-layer structure (the Ti layer/the Cu layer) can be formed. Moreover, in the case where the seed layer 43 is formed by the electroless plating method, for example, the seed layer 43 consisting of a Cu layer (one-layer structure) can be formed by an electroless copper plating method.

Next, a plating resist layer (not shown) is formed on the seed layer 43. The plating resist layer has opening portions provided in a portion where the wiring layer 45 should be formed, i.e. the portion where a wiring 61 and a wiring 63 should be formed. Successively, a metal layer 44 made of copper or the like is formed in the opening portions of the plating resist layer by an electrolytic plating method using the seed layer 43 as a plating power feed path. Then, the plating resist layer is removed. Next, with the metal layer 44 used as a mask, the seed layer 43 is removed by wet etching. In this manner, the wiring layer 45 including the seed layer 43 and the metal layer 44 can be formed. The wiring layer 45 has the wirings 61 and 63. A flexible wiring substrate 40 is constituted by the insulating base member 41, the adhesive layer 42, and the wiring layer 45.

Moreover, as shown in FIG. 4B, a large-sized insulating base member 81 having one face 81A and the other face 81B is prepared. In the large-sized insulating base member 81, for example, a plurality of individual regions in each of which the semiconductor device 1 should be formed are consecutively provided in a matrix form. Here, the individual regions are regions each of which will be finally cut into an individual piece along predetermined cutting lines to form the individual semiconductor device 1. Incidentally, the number of the individual regions contained in the large-sized insulating base member 81 is not limited particularly. An insulating adhesive layer 82 that covers the entire face 81A of the insulating base member 81 is provided on the face 81A. Incidentally, FIGS. 4B to 5B illustrate a state in which the large-sized insulating base member 81 is rotated 180° around the Y1-Y2 direction with respect to FIG. 1.

Next, as shown in FIG. 4C, through holes 52 and 55 are formed at required places in the insulating base member 81 and the adhesive layer 82 to penetrate through the insulating base member 81 and the adhesive layer 82 in the thickness direction. The through holes 51 and 54 can be formed, for example, by a method the same as or similar to the through holes 52 and 55. For example, the through holes 52 are formed on an X1 side of the through hole 55.

Figures 5A, 5B:
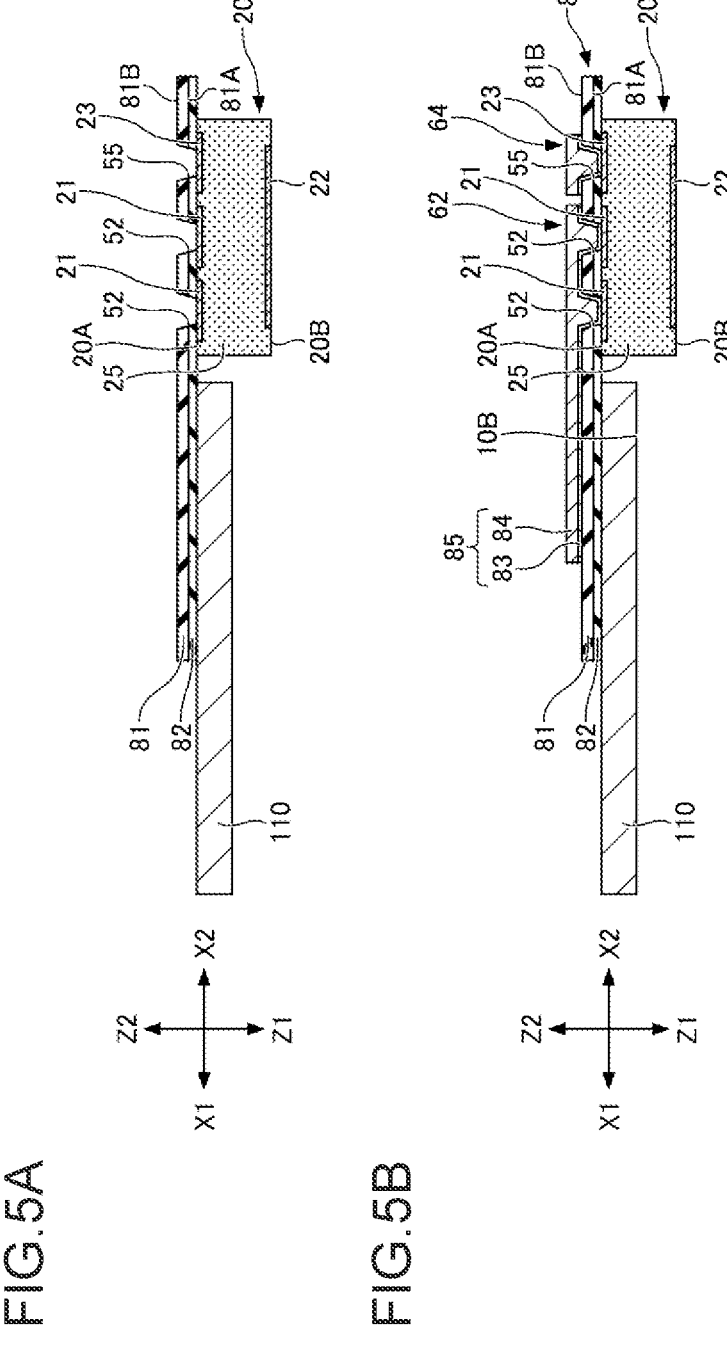
FIGS. 5A and 5B are sectional views showing the method for manufacturing the semiconductor device according to the first embodiment (Part 3)

Next, as shown in FIG. 5A, a semiconductor element 20 and a lead terminal 110 are adhesively bonded to the insulating base member 81 by the adhesive layer 82. On this occasion, alignment is performed to make one face 20A of the semiconductor element 20 face the face 81A of the insulating base member 81, so that electrodes 21 overlap with the through holes 52 and an electrode 23 overlaps with the through hole 55 in the plan view. In addition, the lead terminal 110 is positioned on an X1 side of the semiconductor element 20.

Next, as shown in FIG. 5B, a wiring layer 85 including a seed layer 83 and a metal layer 84 is formed on the other face 81B of the insulating base member 81. The wiring layer 85 can be formed, for example, by a method the same as or similar to the wiring layer 45. The wiring layer 85 has wirings 62 and 64. A flexible wiring substrate 80 is constituted by the insulating base member 81, the adhesive layer 82 and the wiring layer 85.

Figures 6A, 6B:
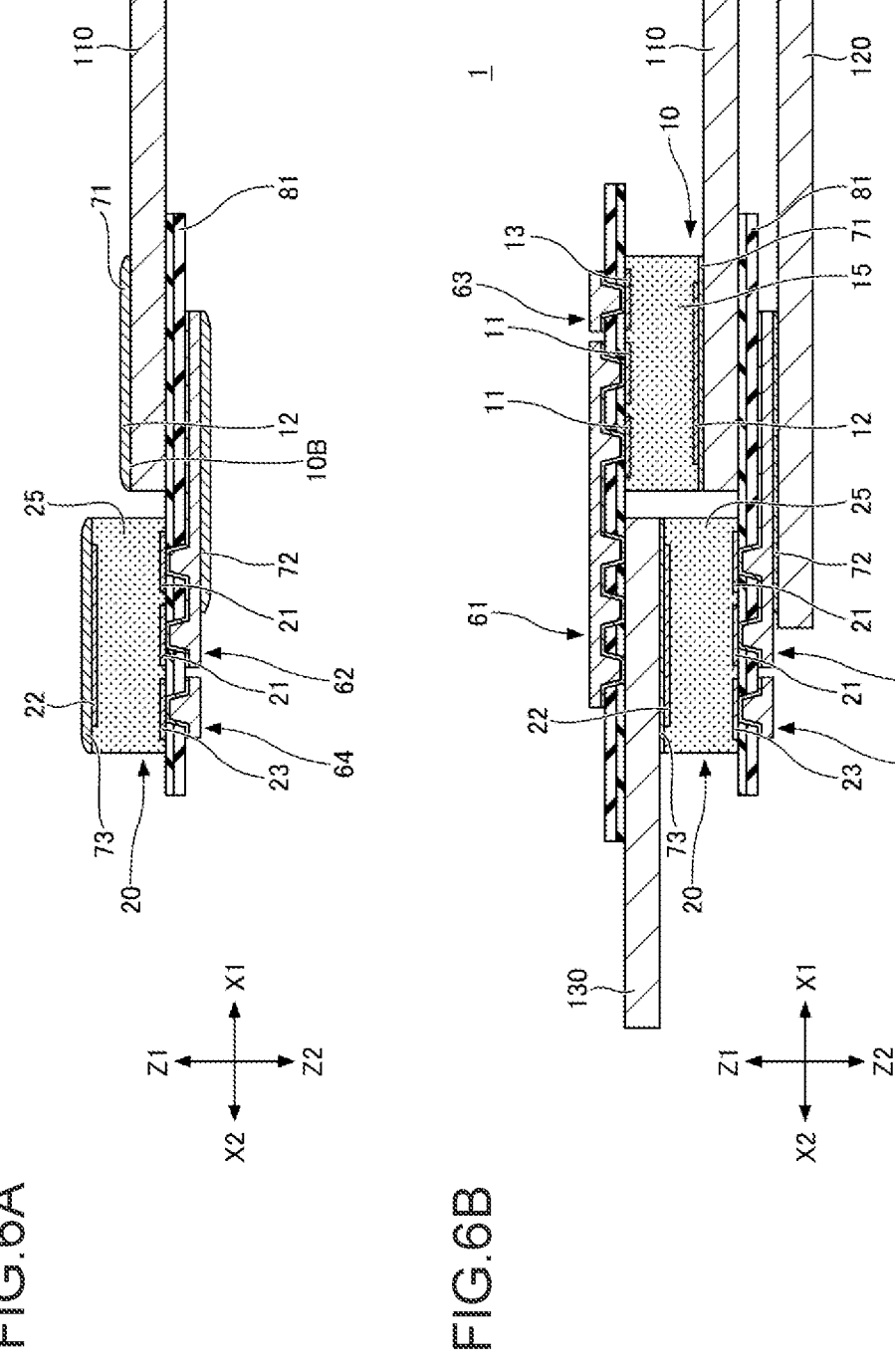
FIGS. 6A and 6B are sectional views showing the method for manufacturing the semiconductor device according to the first embodiment (Part 4)

Next, as shown in FIG. 6A, the flexible wiring substrate 80 is inverted vertically. Then, an electrically conductive adhesive layer 71 is provided on the lead terminal 110, an electrically conductive adhesive layer 72 is provided on a Z2-side face of the wiring 62 of the wiring layer 85, and an electrically conductive adhesive layer 73 is provided on a face 20B of the semiconductor element 20B. The electrically conductive adhesive layers 71 to 73 are in an uncured state.

Next, as shown in FIG. 6B, an electrode 12 is bonded to the lead terminal 110 by the electrically conductive adhesive layer 71, and the lead terminal 130 is bonded to an electrode 22 by the electrically conductive adhesive layer 73. Moreover, a lead terminal 120 is bonded to the wiring 62 by the electrically conductive adhesive layer 72. During the bonding, the electrically conductive adhesive layers 71 to 73 are cured.

In this manner, the semiconductor device 1 according to the first embodiment can be manufactured.

In the semiconductor device 1 according to the first embodiment, current flows from the P terminal toward the N terminal. Therefore, in the lead terminal 110, the current flows from the X1 side toward the X2 side, and in the lead terminal 120, the current flows from the X2 side toward the X1 side. Thus, inductance is generated between the lead terminal 110 and the lead terminal 120. Moreover, in the present embodiment, the distance between the lead terminal 110 and the lead terminal 120 is nearly comparable to the thickness of the flexible wiring substrate 80. Therefore, the distance between the lead terminal 110 and the lead terminal

120 becomes sufficiently small due to the thickness of the flexible wiring substrate 80. Accordingly, the inductance between the lead terminal 110 and the lead terminal 120 which are parallel reciprocating conducting lines can be reduced. Thus, it is possible to provide the semiconductor device 1 that can achieve high-speed switching operation.

Moreover, the wiring layer 45 can be formed on the other face 41B of the insulating base member 41 finely and with high accuracy by the semi-additive method, and the wiring layer 85 can be formed on the other face 81B of the insulating base member 81 finely and with high accuracy by the semi-additive method. The wiring layer 45 may be alternatively formed on the other face 41B of the insulating base member 41 by a subtractive method, and the wiring layer 85 may be alternatively formed on the other side 81B of the insulating base member 81 by a subtractive method. Furthermore, the semiconductor element 10 is adhesively bonded to the face 41A of the insulating base member 41 by the adhesive layer 42 so that the position of the semiconductor element 10 can be fixed to the insulating base member 41 and the wiring layer 45, and the semiconductor element 20 is adhesively bonded to the face 81A of the insulating base member 81 by the adhesive layer 82 so that the position of the semiconductor element 20 can be fixed to the insulating base member 81 and the wiring layer 85. Therefore, according to the present embodiment, it is possible to obtain excellent positional accuracy and connection reliability. Particularly, the semiconductor elements 10 and 20 can be aligned with high accuracy. Further, it is possible to secure high connection reliability between the semiconductor element 10 and the insulating base member 41, and it is possible to secure high connection reliability between the semiconductor element 20 and the insulating base member 81.

Assume that a semiconductor device (power module) in which each of semiconductor elements is fixed to a metal foil (such as a copper foil) provided on the surface of an insulating substrate (such as a ceramic substrate) is manufactured as a reference example. In manufacturing such a semiconductor device, solder reflow is performed to fix the semiconductor element, so that the semiconductor element may be considerably misaligned during this reflow process. Therefore, a relatively large margin is required for the placement of the semiconductor element in a design phase.

On the other hand, in the present embodiment, the semiconductor element 10 is adhesively bonded to the insulating base member 41 in which the through holes 51 and 54 have been formed, and the wiring layer 45 is formed by the semi-additive method. In addition, the semiconductor element 20 is adhesively bonded to the insulating base member 81 in which the through holes 52 and 55 have been formed, and the wiring layer 85 is formed by the semi-additive method. Therefore, excellent positional accuracy and connection reliability can be obtained so that large margins as in the reference example are not required.

Furthermore, the thickness T5 of the laminate structure body of the lead terminal 110 and the semiconductor element 10 and the thickness T6 of the laminate structure body of the semiconductor element 20 and the lead terminal 130 are equal to each other. Therefore, it is easy to perform alignment to bond the electrode 12 to the lead terminal 110 by the electrically conductive adhesive layer 71 and bond the lead terminal 130 to the electrode 22 by the electrically conductive adhesive layer 73.

Second Embodiment

Figure 7:
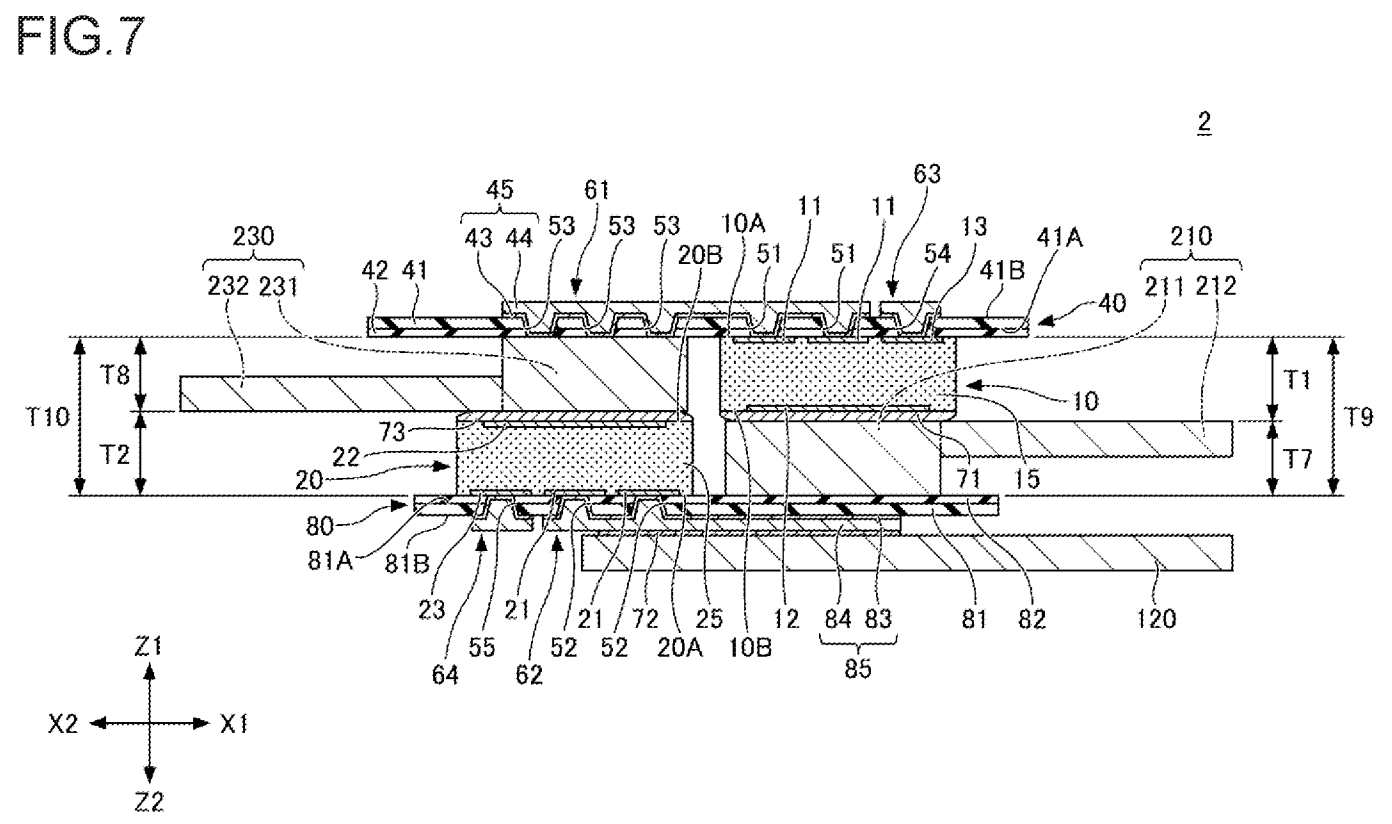

Next, a second embodiment will be described. FIG. 7 is a sectional view showing a semiconductor device according to the second embodiment.

As shown in FIG. 7, the semiconductor device 2 according to the second embodiment has a lead terminal 210 in place of the lead terminal 110, and has a lead terminal 230 in place of the lead terminal 130. Each of the lead terminals 210 and 230 is formed, for example, from a stepped lead frame. The lead terminal 210, 230 is an example of a wiring member.

The lead terminal 210 has a junction portion 211 and an extension portion 212. The junction portion 211 is thicker than the extension portion 212. For example, thickness of the extension portion 212 is equal to the thickness T3 of the lead terminal 110 in the first embodiment, and thickness T7 of the junction portion 211 is larger than the thickness T3. The junction portion 211 is bonded to an electrode 12 of a semiconductor element 10 by an electrically conductive adhesive layer 71, and adhesively bonded to one face 81A of an insulating base member 81 by an adhesive layer 82. The extension portion 212 extends from the junction portion 211 toward an X1 side. For example, a Z1-side face of the junction portion 211 and a Z1-side face of the extension portion 212 are flush with each other. The junction portion 211 is an example of a first junction portion, and the extension portion 212 is an example of a first extension portion.

The lead terminal 230 has a junction portion 231 and an extension portion 232. The junction portion 231 is thicker than the extension portion 232. For example, thickness of the extension portion 232 is equal to the thickness T4 of the lead terminal 130 in the first embodiment, and thickness T8 of the junction portion 231 is larger than the thickness T4. The junction portion 231 is bonded to an electrode 22 of a semiconductor element 20 by an electrically conductive adhesive layer 73, and adhesively bonded to one face 41A of an insulating base member 41 by an adhesive layer 42. The extension portion 232 extends from the junction portion 231 toward an X2 side. For example, a Z2-side face of the junction portion 231 and a Z2-side face of the extension portion 232 are flush with each other. The junction portion 231 is an example of a second junction portion, and the extension portion 232 is an example of a second extension portion. The lead terminal 210 and a lead terminal 120 face each other in an X1-X2 direction, and are electrically connected to each other.

For example, the thickness T7 of the junction portion 211 and the thickness T8 of the junction portion 231 are equal to each other. Therefore, thickness T9 of a laminate structure body of the junction portion 211 and the semiconductor element 10 and thickness T10 of a laminate structure body of the semiconductor element 20 and the junction portion 231 are equal to each other.

The remaining configuration is the same as or similar to that in the first embodiment.

In order to manufacture the semiconductor device 2 according to the second embodiment, the lead terminals 210 and 230 are prepared in advance. Then, the lead terminal 210 is bonded to the semiconductor element 10 and the insulating base member 81 in place of the lead terminal 110, and the lead terminal 230 is bonded to the semiconductor element 20 and the insulating base member 41 in place of the lead terminal 130. In this manner, the semiconductor device 2 can be manufactured.

In the semiconductor device 2 according to the second embodiment, current also flows from a P terminal toward an N terminal. Therefore, in the lead terminal 210, the current flows from the X1 side toward the X2 side, and in the lead terminal 120, the current flows from the X2 side toward the X1 side. Thus, inductance is generated between the lead terminal 210 and the lead terminal 120. On the other hand, a distance between the lead terminal 210 and the lead terminal 120 is defined by the sum of a difference in thickness between the junction portion 211 and the extension portion 212 and thickness of a flexible wiring substrate 80. Accordingly, the distance between the lead terminal 210 and the lead terminal 120 becomes sufficiently small. Thus, the inductance between the lead terminal 210 and the lead terminal 120 which are parallel reciprocating conducting lines can be reduced. Accordingly, it is possible to provide the semiconductor device 2 that can achieve high-speed switching operation and it is possible to sufficiently dissipate heat generated from the semiconductor element 10 by the junction portion 211. Moreover, the semiconductor device 2 having excellent positional accuracy and connection reliability can be provided in a manner the same as or similar to that in the first embodiment.

Furthermore, the thickness T9 of the laminate structure body of the junction portion 211 and the semiconductor element 10 and the thickness T10 of the laminate structure body of the semiconductor element 20 and the junction portion 231 are equal to each other. Therefore, it is easy to perform alignment to bond the electrode 12 to the lead terminal 210 by the electrically conductive adhesive layer 71, and bond the junction portion 231 to the electrode 22 by the electrically conductive adhesive layer 73.

In addition, the junction portion 211 is thicker than the extension portion 212. Therefore, the lead terminal 210 is separated from the lead terminal 120 so as to make it easy to prevent a short circuit between the lead terminals 210 and 120.

Third Embodiment

Figure 8:
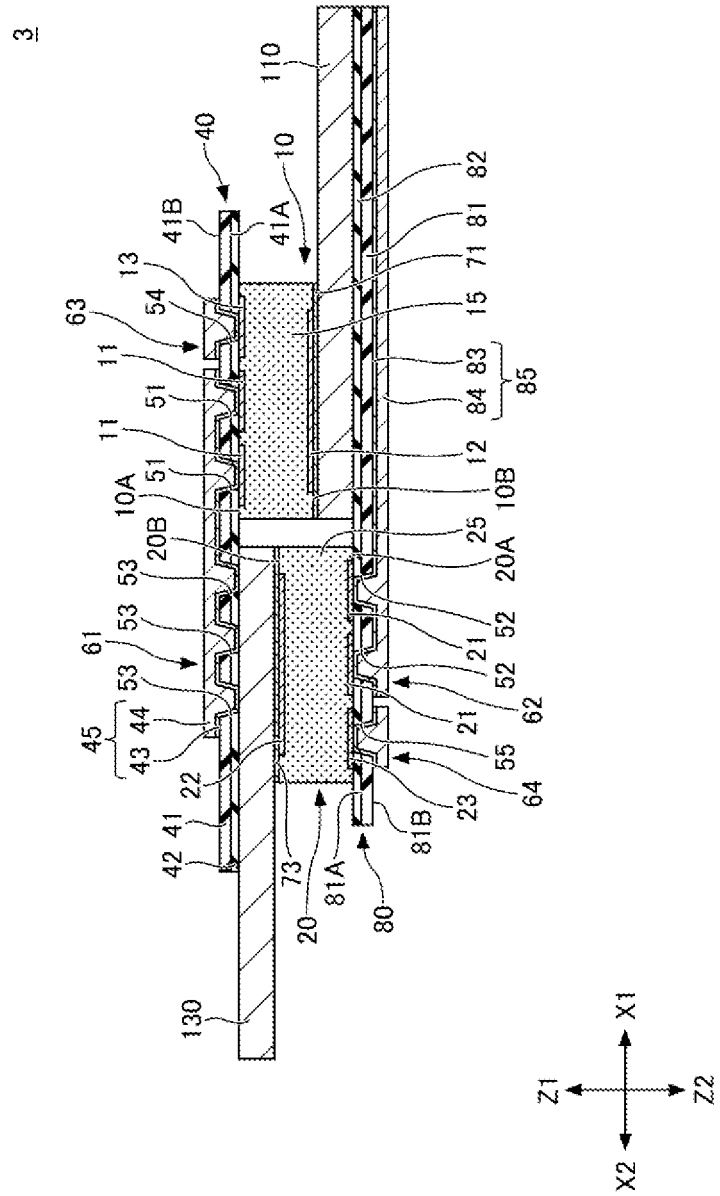
FIG. 8 is a sectional view showing a semiconductor device according to a third embodiment.

Next, a third embodiment will be described. FIG. 8 is a sectional view showing a semiconductor device according to the third embodiment.

As shown in FIG. 8, in the semiconductor device 3 according to the third embodiment, a flexible wiring substrate 80 extends along a Z2-side face of a lead terminal 110 toward an X1 side. In addition, a lead terminal 120 is absent. The lead terminal 110 and a wiring 62 face each other in an X1-X2 direction, and are electrically connected to each other.

The remaining configuration are the same as or similar to that in the first embodiment.

For example, to adhesively bond the lead terminal 110 to one face 81A of an insulating base member 81 in order to manufacture the semiconductor device 3 according to the third embodiment, alignment has to be performed to make the lead terminal 110 and the wiring 62 extend in a common direction (toward the X1 side) as viewed from a semiconductor element 10.

In the semiconductor device 3 according to the third embodiment, the wiring 62 of a wiring layer 85 exerts a function the same as or similar to the lead terminal 120. Thus, inductance is generated between the lead terminal 110 and the wiring 62. On the other hand, a distance between the lead terminal 110 and the wiring 62 becomes sufficiently small due to thickness of the flexible wiring substrate 80. Thus, the inductance between the lead terminal 110 and the wiring 62, which are parallel reciprocating conducting lines, can be reduced more than that in the first embodiment. In addition, the semiconductor device 3 having excellent positional accuracy and connection reliability can be provided in a manner the same as or similar to that in the first embodiment. Furthermore, a step required for bonding the lead terminal 120 can be omitted.

Although the preferred embodiments etc. have been described above in detail, the present disclosure is not limited to the aforementioned embodiments etc., but various modifications and substitutions can be made on the aforementioned embodiments etc. without departing from the scope described in Claims.

What is claimed is:

1. A semiconductor device comprising:
a first semiconductor element comprising a first face and a second face opposite to the first face, wherein a first electrode is provided in the first face and a second electrode is provided in the second face;
a second semiconductor element comprising a third face and a fourth face opposite to the third face, wherein a third electrode is provided in the third face and a fourth electrode is provided in the fourth face;
a first insulating base member comprising a fifth face to which the first face of the first semiconductor element is adhesively bonded, and a sixth face opposite to the fifth face;
a second insulating base member comprising a seventh face to which the third face of the second semiconductor element is adhesively bonded, and an eighth face opposite to the seventh face;
a first wiring that penetrates through the first insulating base member to be electrically connected to the first electrode, and that is disposed on the sixth face of the first insulating base member;
a second wiring that penetrates through the second insulating base member to be electrically connected to the third electrode, and that is disposed on the eighth face of the second insulating base member;
a first wiring member that faces the second face of the first semiconductor element, and that is electrically connected to the second electrode; and
a second wiring member that is provided on the second wiring to be electrically connected to the second wiring,
wherein:
the first wiring member is provided on the seventh face of the second insulating base member;
the first wiring member and the second wiring member face each other and are electrically connected to each other; and
a current flows in a first direction in the first wiring member, and flows in a second direction opposite to the first direction in the second wiring member.

2. The semiconductor device according to claim 1, wherein:
the first wiring member is electrically connected to the second wiring member through the first semiconductor element, the first wiring, the second semiconductor element and the second wiring.

3. The semiconductor device according to claim 1, wherein
a distance between the first wiring member and the second wiring member is defined by the sum of a thickness of the second insulating base member and a thickness of the second wiring disposed on the second insulating base member.

4. The semiconductor device according to claim 1, further comprising:

a first electrically conductive adhesive layer that bonds the first wiring member and the second electrode to each other; and
a second electrically conductive adhesive layer that bonds the second wiring member and the second wiring to each other.

5. The semiconductor device according to claim 1, wherein:
the first wiring member comprises a first lead terminal; and
the second wiring member comprises a second lead terminal.

6. A semiconductor device comprising:
a first semiconductor element comprising a first face and a second face opposite to the first face, wherein a first electrode is provided in the first face and a second electrode is provided in the second face;
a second semiconductor element comprising a third face and a fourth face opposite to the third face, wherein a third electrode is provided in the third face and a fourth electrode is provided in the fourth face;
a first insulating base member comprising a fifth face to which the first face of the first semiconductor element is adhesively bonded, and a sixth face opposite side to the fifth face;
a second insulating base member comprising a seventh face to which the third face of the second semiconductor element is adhesively bonded, and an eighth face opposite to the seventh face;
a first wiring that penetrates through the first insulating base member to be electrically connected to the first electrode, and that is disposed on the sixth face of the first insulating base member;
a second wiring that penetrates through the second insulating base member to be electrically connected to the third electrode, and that is disposed on the eighth face of the second insulating base member; and
a first wiring member that faces the second face of the first semiconductor element, and that is electrically connected to the second electrode,
wherein:
the first wiring member is provided on the seventh face of the second insulating base member;
the first wiring member and the second wiring face each other, and are electrically connected to each other; and
a current flows in a first direction in the first wiring member, and flows in a second direction opposite to the first direction in the second wiring.

7. The semiconductor device according to claim 6, wherein
the first wiring member is electrically connected to the second wiring through the first semiconductor element, the first wiring and the second semiconductor element.

8. The semiconductor device according to claim 6, wherein
a distance between the first wiring member and the second wiring is defined by a thickness of the second insulating base member.

9. The semiconductor device according to claim 1, further comprising:
a third wiring member that is provided between the fourth face of the second semiconductor element and the fifth face of the first insulating base member to be electrically connected to the fourth electrode,
wherein the first wiring is electrically connected to the third wiring member.

10. The semiconductor device according to claim 9, further comprising:

a third electrically conductive adhesive layer that bonds the third wiring member and the fourth electrode to each other.

11. The semiconductor device according to claim 9, wherein the third wiring member comprises a third lead terminal.

12. The semiconductor device according to claim 9, wherein:

the second semiconductor element and the first wiring member are disposed on the seventh face of the second insulating base member;

the first semiconductor element is disposed on the first wiring member; and the third wiring member is disposed on the second semiconductor element.

13. The semiconductor device according to claim 12, wherein the sum of a thickness of the first wiring member and a thickness of the first semiconductor element is equal to the sum of a thickness of the second semiconductor element and a thickness of the third wiring member.

14. The semiconductor device according to claim 9, wherein;

a thickness of the first semiconductor element and a thickness of the second semiconductor element are equal to each other;

the first wiring member comprises:

a first junction portion that is bonded to the first semiconductor element and the second insulating base member and that has a first thickness; and a first extension portion that extends from the first junction portion and that has a second thickness smaller than the first thickness;

the third wiring member comprises:

a second junction portion that is bonded to the first insulating base member and the second semiconductor element and that has a third thickness; and a second extension portion that extends from the second junction portion and that has a fourth thickness smaller than the third thickness; and the first thickness is equal to the third thickness.

15. The semiconductor device according to claim 1, wherein:

the first semiconductor element further comprises a fifth electrode that is provided in the first face;

the second semiconductor element further comprises a sixth electrode that is provided in the third face; and the semiconductor device further comprises:

a third wiring that penetrates through the first insulating base member to be electrically connected to the fifth electrode, and that is disposed on the sixth face of the first insulating base member; and a fourth wiring that penetrates through the second insulating base member to be electrically connected to the sixth electrode, and that is disposed on the eighth face of the second insulating base member.

* * * * *